United States Patent
Jiang (10) Patent No.: US 12,281,408 B2
(45) Date of Patent: Apr. 22, 2025

(54) METHOD FOR PREPARING A SELF-SUPPORTING SUBSTRATE FROM A FILM BASE STRUCTURE COMPRISING A FIRST SUBSTRATE LAYER, A FIRST FILM LAYER, AND A SECOND SUBSTRATE LAYER

(71) Applicant: Yiguan Information Technology (Shanghai) Co., Ltd., Shanghai (CN)

(72) Inventor: Tao Jiang, Kunshan (CN)

(73) Assignee: Yiguan Information Technology (Shanghai) Co., Ltd., Shanghai (CN)

( * ) Notice: Subject to any disclaimer, the term of this patent is extended or adjusted under 35 U.S.C. 154(b) by 156 days.

(21) Appl. No.: 18/097,600

(22) Filed: Jan. 17, 2023

(65) Prior Publication Data
US 2023/0175167 A1   Jun. 8, 2023

Related U.S. Application Data

(63) Continuation of application No. PCT/CN2021/107855, filed on Jul. 22, 2021.

(30) Foreign Application Priority Data

Jul. 23, 2020   (CN) .......................... 202010718502.3

(51) Int. Cl.
*C30B 25/18* (2006.01)
*C30B 29/40* (2006.01)
(Continued)

(52) U.S. Cl.
CPC .......... *C30B 25/186* (2013.01); *C30B 29/406* (2013.01); *H01L 21/02008* (2013.01);
(Continued)

(58) Field of Classification Search
CPC ......... C30B 25/00; C30B 25/02; C30B 25/04; C30B 25/16; C30B 25/18; C30B 25/183; C30B 25/186; C30B 25/20; C30B 25/22; C30B 29/00; C30B 29/10; C30B 29/40; C30B 29/403; C30B 29/406; C23C 16/00; C23C 16/02; C23C 16/04; C23C 16/30; C23C 16/301; C23C 16/303;
(Continued)

(56) References Cited

U.S. PATENT DOCUMENTS 9,650,723 B1 *   5/2017  D'Evelyn ................. C30B 9/00
2017/0145585 A1 *  5/2017  D'Evelyn ........... H01L 29/2003

\* cited by examiner

*Primary Examiner* — Kenneth A Bratland, Jr.
(74) *Attorney, Agent, or Firm* — Hemisphere Law, PLLC; Zhigang Ma (57) ABSTRACT

A method for preparing a self-supporting substrate includes: preparing a thin film base structure including a first substrate layer, a thin film layer and a second substrate layer stacked in sequence; removing the first substrate layer from the thin film layer; continuing to grow a material the same as that of the thin film layer on a side of the thin film layer far away from the second substrate layer to prepare a thick film layer; and removing the second substrate layer from the thick film layer and remaining the thick film layer. In the method, a thin film may be grown on a substrate that has a larger diameter, and a thinness of the thin film will not cause the thin film and/or the substrate to crack. Therefore, a thin film that has a large diameter may be obtained so as to obtain a large-sized self-supporting thick film substrate.

11 Claims, 4 Drawing Sheets

(51) Int. Cl.
*H01L 21/02* (2006.01)
*H01L 21/683* (2006.01)

(52) U.S. Cl.
CPC .............................. *H01L 21/6835* (2013.01); *H01L 2221/68345* (2013.01); *H01L 2221/68381* (2013.01)

(58) Field of Classification Search
CPC ........... H01L 21/02008; H01L 21/6853; H01L 2221/68345; H01L 2221/68381
USPC ......... 117/84, 88–90, 94, 97, 101, 104, 106, 117/937, 952
See application file for complete search history.

```
┌─────────────────────────────────────────────────────────────┐
│ preparing a thin film base structure, where the thin film   │
│ base structure includes: a first substrate layer, a thin    │
│ film layer and a second substrate layer sequentially        │
│ stacked in that order                                       │
└─────────────────────────────────────────────────────────────┘
                              │
                              ▼
┌─────────────────────────────────────────────────────────────┐
│ stripping the first substrate layer from the thin film layer│
└─────────────────────────────────────────────────────────────┘
                              │
                              ▼
┌─────────────────────────────────────────────────────────────┐
│ preparing a thick film layer by continuing to grow a same   │
│ material as that of the thin film layer on a side of the    │
│ thin film layer far away from the second substrate layer    │
└─────────────────────────────────────────────────────────────┘
                              │
                              ▼
┌─────────────────────────────────────────────────────────────┐
│ stripping the second substrate layer from the thick film    │
│ layer and remaining the thick film layer                    │
└─────────────────────────────────────────────────────────────┘
```

METHOD FOR PREPARING A SELF-SUPPORTING SUBSTRATE FROM A FILM BASE STRUCTURE COMPRISING A FIRST SUBSTRATE LAYER, A FIRST FILM LAYER, AND A SECOND SUBSTRATE LAYER

TECHNICAL FIELD

The disclosure relates to the technical field of semiconductors, and particularly relates to a method for preparing a self-supporting substrate.

DESCRIPTION OF RELATED ART

The research and application of gallium nitride (GaN) materials is the frontier and hot spot of current global semiconductor research, GaN is a novel semiconductor material for developing microelectronic devices and optoelectronic devices. Together with semiconductor materials such as silicon carbide (SiC) and diamond, GaN is known as the third-generation semiconductor material followed by a first generation of germanium (Ge) and silicon (Si) semiconductor materials, a second generation of gallium arsenide (GaAs) and indium phosphide (InP) compound semiconductor materials. It has wide direct band gap, strong atomic bond, high thermal conductivity, good chemical stability (i.e., it is hardly corroded by any acid) and strong anti-radiation capability, and it has broad prospects in the application of photoelectrons, high-temperature and high-power devices and high-frequency microwave devices. The GaN materials have been widely applied to various commercial fields, such as light emitting diodes (LEDs), power amplifiers of communication base stations, chargers in consumer electronics, etc.

For GaN materials, heteroepitaxial defect density is quite high for a long time due to the absence of substrate single crystals. At present, in order to obtain a GaN single crystal substrate, the following three methods are mainly used: the first method is to prepare a GaN single crystal by directly reacting nitrogen and gallium at a high temperature and high pressure; the second method is to grow a GaN single crystal at a lower temperature and nitrogen pressure by using a flux method; and the third method is to use hydride vapor phase epitaxy (HVPE) to grow GaN thick film on a heterogeneous substrate to obtain a GaN self-supporting single crystal substrate. Because of the limitation of the process principle, it is difficult to use the first two methods to prepare large-size crystals. Therefore, the commercial GaN single crystal substrates are mainly prepared by HVPE technology, which has the advantages of simple equipment, low cost, fast growth speed and the like. Because the HVPE technology adopts heterogeneous substrates, the size of the GaN single crystal substrate can be determined by the size of the heterogeneous epitaxial substrate such as sapphire, SiC and silicon-based substrate, and it is easy to obtain large-sized single crystal substrates. Especially, the technology of GaN self-supporting single crystal substrates based on sapphire substrates has been widely used commercially.

The international mainstream research on preparing the GaN self-supporting single crystal substrate on the sapphire substrate based on the HVPE technology is devoted to solving two main problems. One problem is that the sapphire material and the GaN material have large lattice mismatch and thermal mismatch problems, and when the epitaxial film of the GaN material reaches dozens of microns, the epitaxial film will crack due to stress, so that the yield of the prepared large-size GaN self-supporting single crystal substrate is seriously influenced; The other problem is how to separate the GaN thick film from the substrate. Various interposer technologies and pattern masking processes are widely studied and applied to reduce cracking caused by lattice mismatch and improve crystal quality, such as Japan Sumitomo Electric Industries, Ltd.

At present, the research on GaN substrates at home and abroad is carried out by using the metal-organic chemical vapor deposition (MOCVD) equipment and the HVPE equipment separately. That is, the MOCVD equipment is used to grow a 0.1-1 micrometres (μm) crystalline layer on a sapphire substrate, then the HVPE equipment is used to grow a GaN substrate layer of about 300 microns, and finally, the original substrate is stripped, polished, and the like. The HVPE equipment is also used to directly grow a nucleation layer on the sapphire substrate at low temperature, and then increase the temperature to grow a certain thickness of the GaN thick film.

However, due to lattice mismatch and thermal mismatch, when the thickness of GaN reaches a certain degree, the substrate becomes a bowl-shaped bend, which seriously affects the yield of substrate stripping, and at the same time, since the obtained thick film is also curved and uneven, it is not only necessary to process the thick film into a flat sheet in a mechanical grinding manner, but also limit the accessibility of the large-sized thick film. If the size of the thick film is too large, the bowl-shaped bending will become unbearable, resulting in cracking or chipping of the substrate and thick film. Current methods generally maximize the growth of thick films on substrates of 4 inches or 6 inches, and larger sapphire substrates, such as 8 inches and 10 inches substrates, do not withstand bending caused by such methods.

SUMMARY

In order to solve the above problems in the prior art, the present disclosure provides a method for preparing a self-supporting substrate. The technical problem to be solved by the present disclosure is realized by the following technical solutions:

A method for preparing a self-supporting substrate, includes:
  preparing a thin film base structure, where the thin film base structure includes: a first substrate layer, a thin film layer, and a second substrate layer sequentially stacked in that order;
  stripping the first substrate layer from the thin film layer;
  preparing a thick film layer by continuing to grow a same material as that of the thin film layer on a side of the thin film layer far away from the second substrate layer; and
  stripping the second substrate layer from the thick film layer, and remaining the thick film layer.

In an embodiment, the preparing a thin film base structure, includes:
  selecting the first substrate layer;
  preparing the thin film layer on the first substrate layer; and
  preparing the second substrate layer on a side of the thin film layer far away from the first substrate layer.

In an embodiment, the preparing the second substrate layer on a side of the thin film layer far away from the first substrate layer, includes:

selecting the second substrate layer; and
bonding the thin film layer and the second substrate layer together.

In an embodiment, the bonding the thin film layer and the second substrate layer together, includes:
attaching the thin film layer and the second substrate layer together by at least one adhesive layer; and
bonding the thin film layer and the second substrate layer together by wafer bonding.

In an embodiment, the at least one adhesive layer includes: a first adhesive layer and a second adhesive layer, and
the attaching the thin film layer and the second substrate layer together by at least one adhesive layer, includes:
preparing the first adhesive layer on the thin film layer;
preparing the second adhesive layer on the second substrate layer;
attaching the thin film layer and the second substrate layer together by the first adhesive layer and the second adhesive layer.

In an embodiment, the stripping the first substrate layer from the thin film layer, includes:
stripping the first substrate layer from the thin film layer by one of laser stripping and chemical etching.

In an embodiment, the preparing a thick film layer by continuing to grow a same material as that of the thin film layer on a side of the thin film layer far away from the second substrate layer, includes:
continuing to grow the same material as that of the thin film layer on the side of the thin film layer far away from the second substrate layer to prepare the thick film layer by one of MOCVD and HVPE.

In an embodiment, the stripping the second substrate layer from the thick film layer, includes:
stripping the second substrate layer from the thick film layer by chemical etching.

In an embodiment, materials of the second substrate layer and the thin film layer are a same series of materials.

In an embodiment, the material of the thin film layer is a GaN series material.

The present disclosure has the advantages that:

According to the method for preparing the self-supporting substrate provided by the present disclosure, a thin film can be grown on a substrate with a larger diameter, because the thickness of the thin film is very thin, the thin film and/or the substrate will not be cracked, thus a thin film with a larger diameter can be obtained, and a large-sized self-supporting thick film substrate can be obtained.

The present disclosure will be further described in detail below with reference to the drawings and embodiments.

DETAILED DESCRIPTION OF EMBODIMENTS

The present disclosure is further described in detail below in combination with specific embodiments, but the implementation mode of the present disclosure is not limited to this.

First Embodiment

Figure 1:
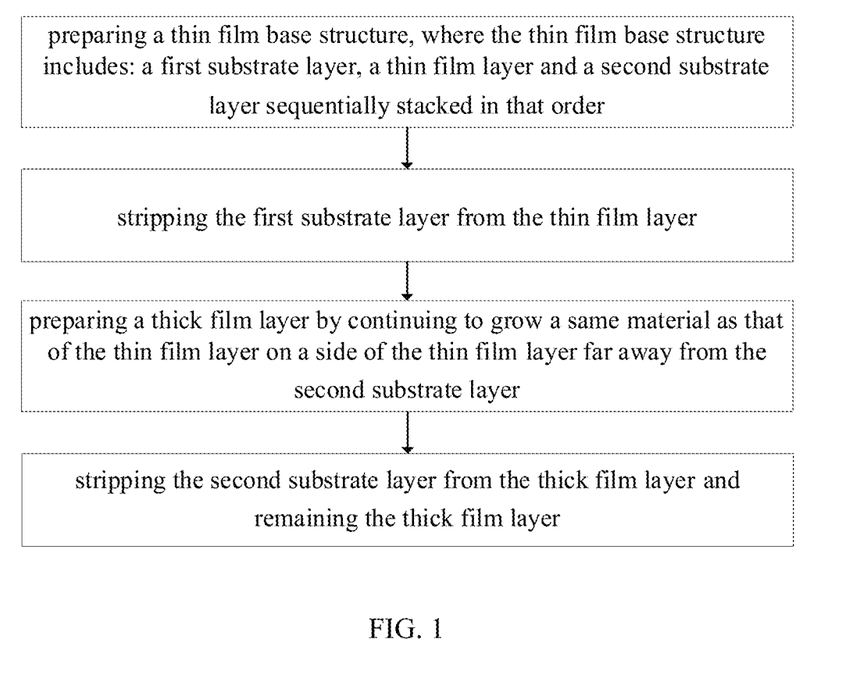
FIG. 1 illustrates a flowchart of a method for preparing a self-supporting substrate according to an embodiment of the present disclosure.

Please refer to FIG. 1, FIG. 1 illustrates a flowchart of a method for preparing a self-supporting substrate provided by the first embodiment of the present disclosure. The first embodiment provides the method for preparing the self-supporting substrate, which includes the following steps.

Step 1, preparing a thin film base structure, where the thin film base structure includes a first substrate layer, a thin film layer and a second substrate layer which are sequentially stacked in that order.

Figure 2A:
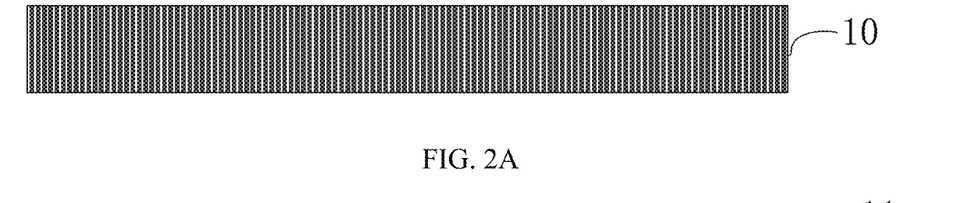
FIG. 2A to FIG. 2I illustrate schematic process diagrams of the method for preparing the self-supporting substrate according to an embodiment of the present disclosure.

Step 1.1, please refer to FIG. 2A, selecting the first substrate layer 10.

The first substrate layer 10 may include, for example, silicon (Si), silicon carbide (SiC), diamond, sapphire ($Al_2O_3$), gallium arsenide (GaAs), aluminum nitride (AlN), gallium nitride (GaN), metal, metal oxide, compound semiconductor, glass, quartz, or composite materials.

Preferably, a material of the first substrate layer 10 is the sapphire.

Figure 2B:
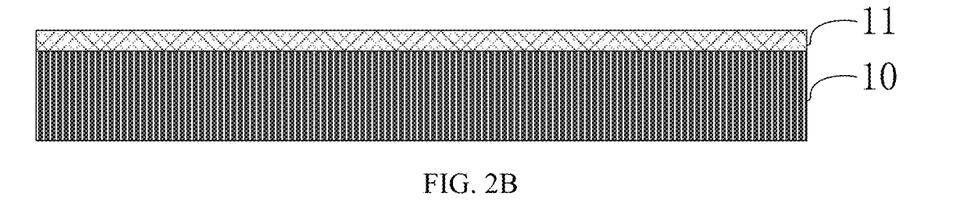

Step 1.2, please refer to FIG. 2B, preparing the thin film layer 11 on the first substrate layer 10.

A material of the thin film layer 11 in this embodiment can be, for example, a III-V compound semiconductor material. Specifically, the material of the thin film layer 11 in this embodiment can be a GaN series material, and the GaN series material mainly includes GaN, boronnitride (BN), and $Al_xGa_yIn_{1-x-y}N$ alloy material, where $0 \leq x \leq 1$, $0 \leq y \leq 1$, and $0 \leq x+y \leq 1$. Generally, a thickness of the thin film layer 11 is below 10 μm.

Furthermore, the GaN series material can be the undoped material, the n-type doped material or the p-type doped material.

Furthermore, a growth method of the GaN series material may include: depositing with the single doped material or the undoped material, or with a combination of undoped and doped materials, or with a combination of N-doped and P-doped materials.

Preferably, the thickness of the thin film layer 11 is in a range from 0.1 μm to 20 μm.

In this embodiment, a specific method of preparing the thin film layer 11 on the first substrate layer 10 is not specifically limited, and those skilled in the art can choose different preparation methods to prepare the thin film layer 11 on the first substrate layer 10 according to specific needs. It should be noted that FIG. 2B is only used to illustrate the positional relationship between the first substrate layer 10 and the thin film layer 11 in this embodiment, and does not represent their structural relationship. For example, the thin film layer 11 can be directly grown on the first substrate layer 10 by MOCVD, or a supporting structure for supporting the thin film layer 11 can be prepared on the first substrate layer 10, so as to realize the preparation of the thin film layer 11. In order to better understand this embodiment, this embodiment illustrates a method for preparing the thin film layer 11 with a supporting structure with a specific example, such as steps 1.211 to 1.212, in which:

Step 1.211, preparing several seed crystal structures on the first substrate layer 10. The seed crystal structures on the first substrate layer 10 are mutually independent structures, and there are holes among the seed crystal structures and these holes are connected with (i.e., communicated with) one another.

In this embodiment, the several seed crystal structures can be prepared on the first substrate layer 10 through steps 1.2111 to 1.2113, in which:

Step 1.2111, forming several convex structures and several concave structures on a surface of the first substrate layer 10 in a patterning manner.

Figure 3A:
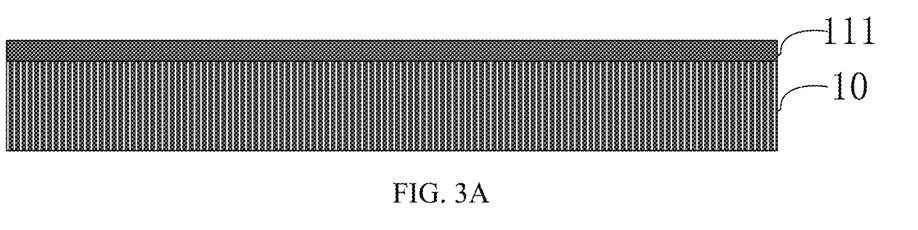
FIG. 3A to FIG. 3F illustrate schematic process diagrams of a method for preparing a thin film layer according to an embodiment of the present disclosure.

Specifically, the forming the several convex structures and the several concave structures on the first substrate layer 10 can specifically include steps 1.21111 to 1.21113, in which:

Step 1.21111, please refer to FIG. 3A, a mask layer 111 is grown on the first substrate layer 10.

Figure 3B:
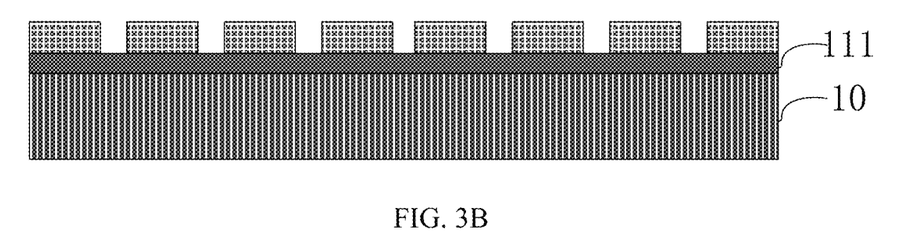

Step 1.21112, please refer to FIG. 3B, the mask layer 111 is exposed, developed and etched according to a preset pattern to expose a part of the surface of the first substrate layer 10.

Among them, the preset pattern is the pattern that the first substrate layer 10 needs to show, and the required pattern can be transferred to the mask layer 111 through exposure, development and etching processes, so as to expose the part of the surface of the first substrate layer 10.

Figure 3C:
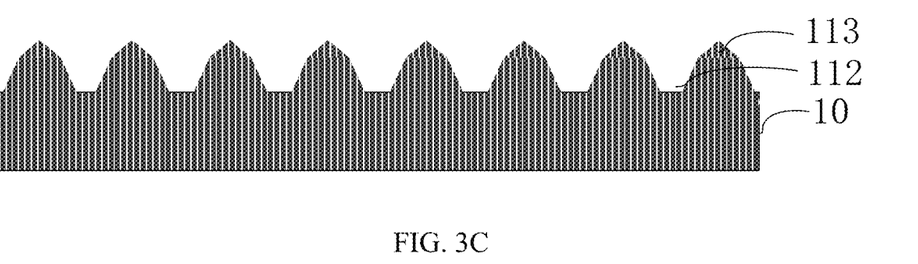

Step 1.21113, please refer to FIG. 3C, the exposed first substrate layer 10 is etched, and the several convex structures 112 and several concave structures 113 are formed on the first substrate layer 10.

Figure 3D:
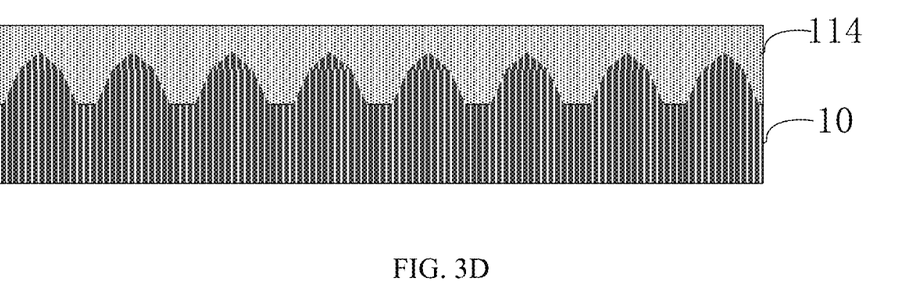

Step 1.2112, please refer to FIG. 3D, an epitaxial layer 114 with a smooth surface is grown on a side of the first substrate layer 10 with the convex structures 112.

Specifically, the epitaxial growth can be performed on the side of the first substrate layer 10 with the convex structures 112 by adopting MOCVD or HVPE to obtain the epitaxial layer 114 with the smooth surface.

In this embodiment, a material of the epitaxial layer 114 may be a III-V compound semiconductor material, for example, specifically a GaN series material.

Figure 3E:
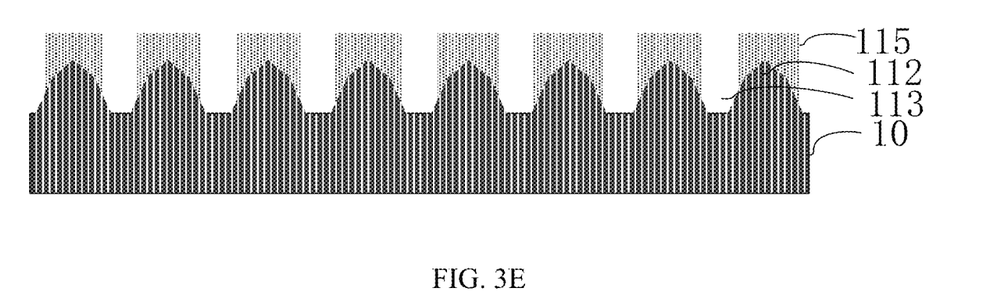

Step 1.2113, please refer to FIG. 3E, the epitaxial layer 114 above each of the concave structures 113 on the first substrate layer 10 is removed until the first substrate layer 10 is exposed, and at least part of the epitaxial layer 114 above each of the convex structures 112 on the first substrate layer 10 is retained to form the several seed crystal structures 115.

Specifically, in this embodiment, the corresponding part of the epitaxial layer 114 above each concave structure 113 is removed until the surface of the first substrate layer 10 is completely exposed, and it is necessary to ensure that no material of the epitaxial layer remains on the exposed surface of the first substrate layer 10, while the corresponding part of the epitaxial layer 114 above each convex structure 112 is retained, and the corresponding part of the epitaxial layer 114 above each convex structure 112 is used as the seed crystal structure 115.

Figure 3F:
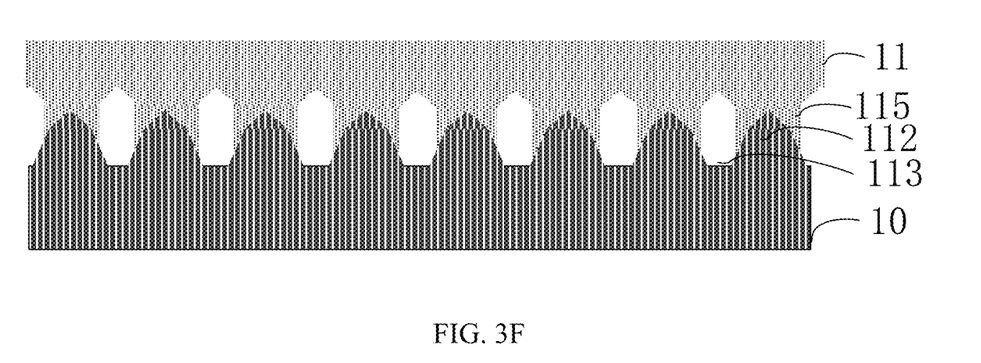

Step 1.212, please refer to FIG. 3F, the thin film layer 11 is grown on the several seed crystal structures 115.

Specifically, the semiconductor thin film layer material is continuously grown on the seed crystal structures 115 by MOCVD, HVPE or molecular beam epitaxy until the thin film layer 11 with the smooth surface is obtained. Preferably, the material of the thin film layer 11 is the same as the material of the seed crystal structure 115.

It should be noted that other methods for preparing the thin film layer 11 are also applicable to this embodiment, and will not be repeated here.

Step 1.3, preparing the second substrate layer on a side of the thin film layer 11 far away from the first substrate layer 10.

Figure 2C:
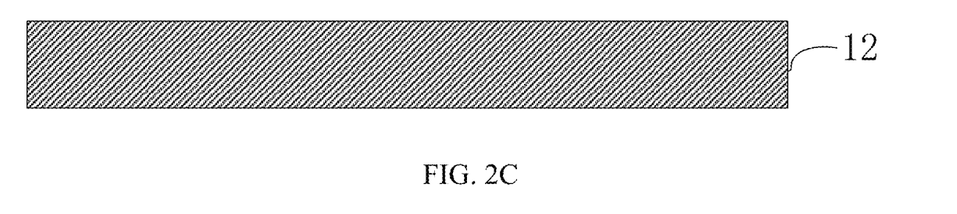

Step 1.31, please refer to FIG. 2C, selecting the second substrate layer 12.

Specifically, a material of the second substrate layer 12 may be, for example, GaN series material or SiC, and the material of the second substrate layer 12 may also be any other material, which will not be described here.

Furthermore, the materials of the second substrate layer 12 and the thin film layer 11 are the same series of materials.

Preferably, the materials of the second substrate layer 12 and the thin film layer 11 are both the GaN series material.

Step 1.32, bonding the thin film layer 11 and the second substrate layer 12 together.

In this embodiment, the thin film layer 11 and the second substrate layer 12 are bonded together, so that the thin film layer 11 has a temporary substrate on a side far away from the first substrate layer 10, and the temporary substrate is the second substrate layer 12.

Step 1.321, attaching the thin film layer 11 and the second substrate layer 12 together by at least one adhesive layer.

Furthermore, the at least one adhesive layer includes a first adhesive layer and a second adhesive layer.

Figure 2D:
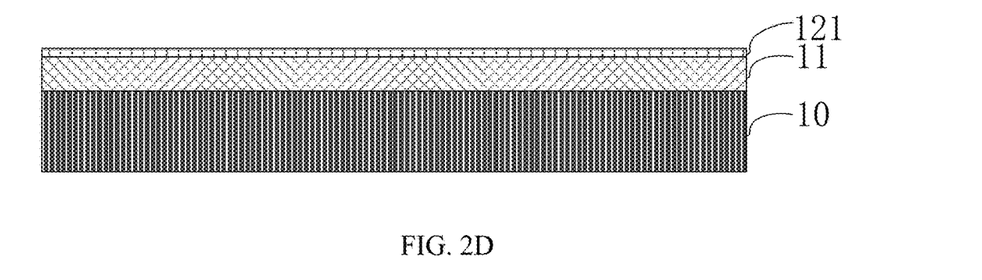

Furthermore, the step 1.321 may include, for example, steps 1.3211 to 1.3213, where:

Step 1.3211, please refer to FIG. 2D, preparing the first adhesive layer 121 on the thin film layer 11.

For example, a layer of adhesive layer material can be coated on the thin film layer 11 to prepare the first adhesive layer 121, and the first adhesive layer 121 can be silicon dioxide ($SiO_2$), for example.

Figure 2E:
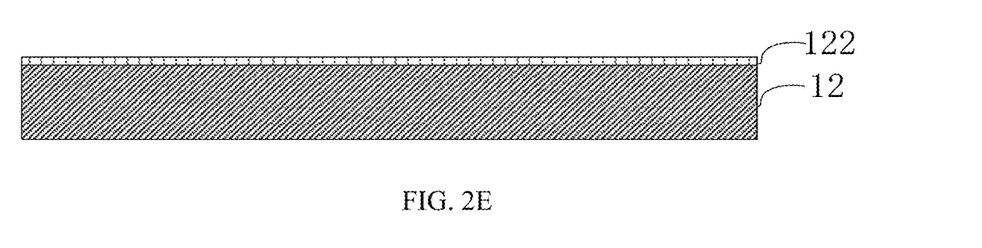

Step 1.3212, please refer to FIG. 2E, preparing the second adhesive layer 122 on the second substrate layer 12.

For example, a layer of adhesive layer material can be coated on the second substrate layer 12 to prepare the second adhesive layer 122, and the second adhesive layer 122 can be $SiO_2$, for example.

Figure 2F:
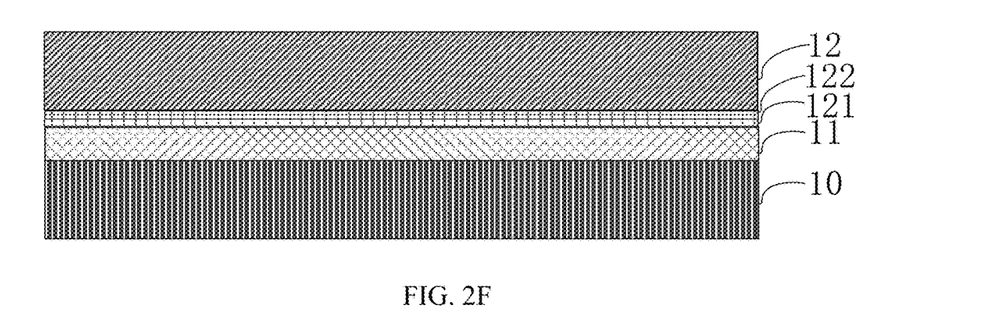

Step 1.3213, please refer to FIG. 2F, attaching the thin film layer 11 and the second substrate layer 12 together by the first adhesive layer 121 and the second adhesive layer 122.

Specifically, the first adhesive layer 121 on the film layer 11 and the second adhesive layer 122 on the second substrate layer 12 are attached to each other.

Step 1.322, bonding the thin film layer 11 and the second substrate layer 12 together by wafer bonding.

Specifically, in a certain temperature and vacuum environment, the thin film layer 11 and the second substrate layer 12 are bonded together by applying a certain pressure to the second substrate layer 12, so that the second substrate layer 12 and the thin film layer 11 can be firmly bonded together. For example, a plasma treatment process can also be added during bonding.

Figure 2G:
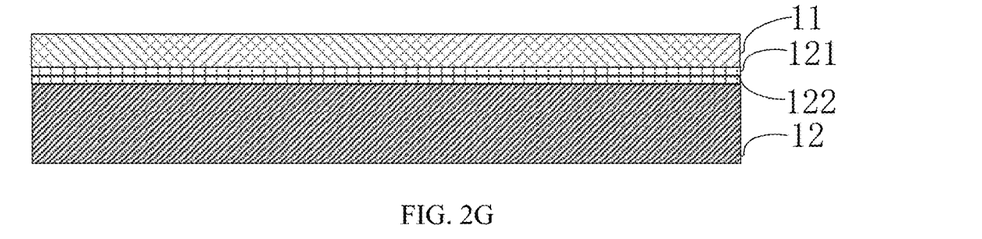

Step 2, please refer to FIG. 2G, stripping the first substrate layer 10 from the thin film layer 11.

Specifically, the first substrate layer 10 is stripped from the thin film layer 11 by laser stripping or chemical etching.

Furthermore, the first substrate layer 10 of this embodiment can be stripped from the thin film layer 11 by the laser stripping method, which specifically includes: the first substrate layer 10 is irradiated with a laser beam from a side far away from the thin film layer 11 to obtain the thin film layer 11 and the second substrate layer 12 which are sequentially stacked.

Specifically, a certain power of laser beam is used to conduct laser irradiation processing from the side of the first substrate layer 10 far away from the thin film layer 11. The laser energy can be selected to irradiate the thin film layer 11 through the first substrate layer 10, and the laser energy can cause the junction between the first substrate layer 10 and the thin film layer 11 to separate, so that the first substrate layer 10 is separated from the thin film layer 11.

In addition, the first substrate layer 10 of this embodiment can be stripped from the thin film layer 11 by chemical etching, which specifically includes: the first substrate layer 10 and the thin film layer 11 can be treated by alkaline solution or molten liquid alkali to obtain the single crystal substrate, thereby to obtain the thin film layer 11 and the second substrate layer 12 which are sequentially stacked.

Specifically, the first substrate layer 10, the thin film layer 11 and the second substrate layer 12 stacked in sequence are put into a chemical etching solution, preferably the chemical etching solution is the alkaline solution or the molten liquid alkali, usually potassium hydroxide (KOH) or sodium hydroxide (NaOH). If it is the alkaline solution, a concentration of the alkaline solution may be in a range from 0.1% to 99.9%, preferably 40%, and a chemical etching temperature may be in a range from 0 Celsius degrees (° C.) to 100° C., preferably 80° C. If it is the molten liquid alkali, the temperature may be in a range from 100° C. to 400° C., preferably 230° C. For example, if both the thin film layer 11 and the second substrate layer 12 are made of the GaN series material, the GaN series material at the junction between the thin film layer 11 and the first substrate layer 10 will be dissolved, and the junction between the first substrate layer 10 and the thin film layer 11 will be broken, so that the thin film layer 11 will be separated from the first substrate layer 10.

Figure 2H:
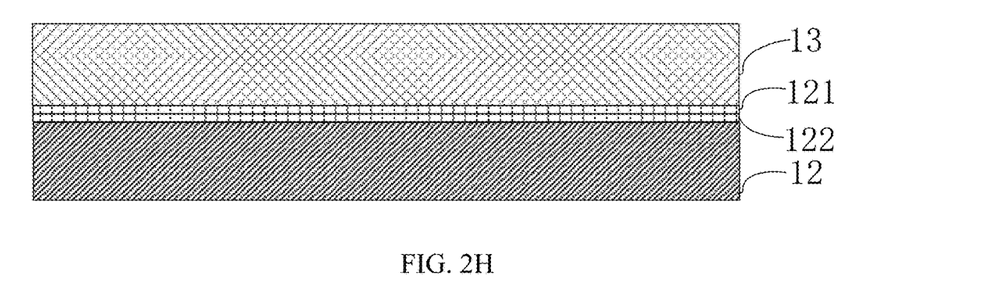

Step 3, please refer to FIG. 2H, preparing a thick film layer 13 by continuing to grow a same material as that of the thin film layer 11 on a side of the thin film layer 11 far away from the second substrate layer 12.

Specifically, after the first substrate layer 10 is removed, the thin film layer 11 is bonded to the second substrate layer 12. At this time, the second substrate layer 12 can be used as a temporary substrate to continuously grow the same material as that of the thin film layer 11 on the thin film layer 11, thereby converting the thin film layer 11 into the thick film layer 13.

For example, by MOCVD or HVPE, the same material as that of the thin film layer 11 can be continuously grown on the side of the thin film layer 11 far away from the second substrate layer 12 to prepare the thick film layer 13. In addition, it should be noted that the process of growing the thick film layer 13 can also be other process methods, and this embodiment is not specifically limited to this.

Preferably, the size of the thick film layer 13 can be 2 inches, 4 inches, 6 inches, 8 inches, 10 inches or 12 inches, or other sizes.

Figure 2I:
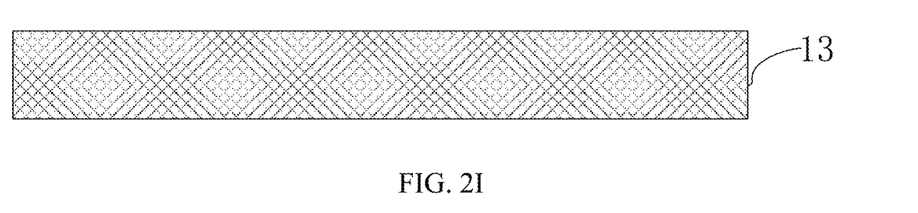

Step 4, please refer to FIG. 2I, stripping the second substrate layer 12 from the thick film layer 13 and remaining the thick film layer 13.

Specifically, the first adhesive layer 121 and the second adhesive layer 122 can be removed by a chemical etching method, so that the second substrate layer 12 is stripped from the thick film layer 13 to obtain the thick film layer 13.

In addition, after the second substrate layer 12 is stripped from the thick film layer 13, the thick film layer 13 can be planarized by chemical mechanical polishing (CMP) to obtain a flat thick film substrate.

At present, when the diameter of the substrate is too large, the traditional method of growing GaN thick film on the substrate can hardly be completed. This is also the reason why the products that grow the thick film on the substrate and then strip it can only achieve 4 inches at the maximum. Even if it can achieve 6 inches, the yield is extremely low. The reason is that due to lattice mismatch and thermal mismatch between the substrate and GaN, the thick film will cause the substrate to bend seriously until it cracks, and the larger the substrate size is, the easier it is to crack. By adopting the method for preparing the self-supporting substrate proposed in this embodiment, a thin film can be grown on a substrate with a larger diameter, and the thin film will not crack the film and/or the substrate, so that a thin film with a larger diameter can be obtained, and finally a large-sized self-supporting thick film substrate can be obtained.

Specifically, at present, the traditional methods are to prepare GaN thick films on heterogeneous substrates, which will easily lead to substrate bending due to lattice mismatch and thermal mismatch. The larger the size of the prepared GaN thick films, the larger the substrate size, and the more serious the bending will be, thus affecting the yield of the prepared GaN thick films. In this embodiment, the thin film layer is first prepared on the first substrate layer; Then, the second substrate layer with the same material as the thin film layer is prepared on the thin film layer, the first substrate layer is stripped, and then the thin film layer is grown into the thick film layer, thus realizing the preparation of a GaN thick film structure; and since the second substrate layer with the same material as the thin film layer or the second substrate layer with other materials close to the thermal expansion coefficient of the material of the thin film layer can be selected, the thermal mismatch caused by heterogeneous materials is avoided, Therefore, the bending and cracking phenomena generated in the preparation of the thick film can be avoided, and the self-supporting GaN thick film structure with large size and flatness can be prepared, and the yield can also be ensured.

The thick film substrate prepared by the method for preparing the self-supporting substrate provided in this embodiment has a remarkable feature, that is, if the prepared thick film substrate is made of GaN material, the surface separated from the second substrate layer is the Ga surface, that is, the surface grown on the first substrate layer is the Ga surface, and this surface is also oriented to the C axis.

The method for preparing the self-supporting substrate in this embodiment can prepare large-sized GaN self-supporting substrates, which will greatly reduce the research and development (R&D) and production costs of GaN materials and devices, and has significant research and commercial value for promoting the application of GaN.

In the description of the present disclosure, the terms "first" and "second" are only used for description purposes, and cannot be understood as indicating or implying relative importance or implying the number of indicated technical features. Thus, the features defined as "first" and "second" can explicitly or implicitly include one or more of these features. In the description of the present disclosure, "several" means two or more, unless otherwise specifically defined.

In the present disclosure, unless otherwise specified and defined, the first feature "above" or "below" the second feature may include direct contact between the first and second features, or contact between the first and second features through other features instead of direct contact. Moreover, the first feature "above", and "on" the second feature include that the first feature is directly above and obliquely above the second feature, or only indicates that the horizontal height of the first feature is higher than the second feature. The first feature "below", and "under" of the second feature include the first feature directly below and obliquely below the second feature, or only indicate that the horizontal height of the first feature is less than the second feature.

In the description of this specification, reference to the description of the terms "one embodiment", "some embodiments", "examples", "specific examples", or "some examples" means that the specific features, structures, materials, or features described in combination with this embodiment or example are included in at least one embodiment or example of the invention. In this specification, the illustrative expression of the above terms need not refer to the same embodiments or examples. Moreover, the specific features, structures, materials or characterization described may be combined in an appropriate manner in any one or more embodiments or examples. In addition, those skilled in the art can combine and combine different embodiments or examples described in this specification.

The above content is a further detailed description of the present disclosure in combination with specific preferred embodiments, and it cannot be determined that the specific implementation of the present disclosure is limited to these descriptions. For ordinary technicians in the technical field to which the present disclosure belongs, without departing from the concept of the present disclosure, some simple deduction or replacement can be made, which should be considered as belonging to the scope of protection of the present disclosure.

What is claimed is:

1. A method for preparing a self-supporting substrate, comprising:
    preparing a film base structure, wherein the film base structure comprises: a first substrate layer, a first film layer, and a second substrate layer sequentially stacked in that order; and the preparing a film base structure, comprises:
        selecting the first substrate layer;
        growing the first film layer above the first substrate layer; wherein a material of the first substrate layer is different from that of the first film layer; and
        preparing the second substrate layer on a side of the first film layer facing away from the first substrate layer to make the first film layer completely cover the second substrate layer along a lengthwise direction of the second substrate layer;
    stripping the first substrate layer from the first film layer;
    converting the first film layer into a second film layer by continuing to grow a same material as that of the first film layer on a side, facing away from the second substrate layer, of the first film layer, which completely covers the second substrate layer along the lengthwise direction of the second substrate layer; and
    stripping the second substrate layer from the second film layer, and remaining the second film layer;
    wherein the growing the first film layer on the first substrate layer, comprises:
        preparing a plurality of seed crystal structures on the first substrate layer; and
        growing the first film layer on the plurality of seed crystal structures;
    wherein the preparing a plurality of seed crystal structures on the first substrate layer, comprises:
        forming a plurality of convex structures and a plurality of concave structures on a surface of the first substrate layer in a patterning manner;
        growing an epitaxial layer on the surface of the first substrate layer to cover the plurality of convex structures and the plurality of concave structures; wherein the epitaxial layer is made of a GaN series material; and
        removing a part of the epitaxial layer above the plurality of concave structures on the first substrate layer until the first substrate layer is exposed, and retaining a part of the epitaxial layer above of the plurality of convex structures on the first substrate layer to form the plurality of seed crystal structures.

2. The method for preparing the self-supporting substrate according to claim 1, wherein the preparing the second substrate layer on a side of the first film layer facing away from the first substrate layer, comprises:
    selecting the second substrate layer; and
    bonding the first film layer and the second substrate layer together.

3. The method for preparing the self-supporting substrate according to claim 2, wherein the bonding the first film layer and the second substrate layer together, comprises:
    attaching the first film layer and the second substrate layer together by at least one adhesive layer; and
    bonding the first film layer and the second substrate layer together by wafer bonding.

4. The method for preparing the self-supporting substrate according to claim 3, wherein the at least one adhesive layer comprises: a first adhesive layer and a second adhesive layer, and
    the attaching the first film layer and the second substrate layer together by at least one adhesive layer, comprises:
        preparing the first adhesive layer on the first film layer;
        preparing the second adhesive layer on the second substrate layer; and
        attaching the first film layer and the second substrate layer together by the first adhesive layer and the second adhesive layer.

5. The method for preparing the self-supporting substrate according to claim 1, wherein the stripping the first substrate layer from the first film layer, comprises:
    stripping the first substrate layer from the first film layer by one of laser stripping and chemical etching.

6. The method for preparing the self-supporting substrate according to claim 1, wherein the converting the first film layer into a second film layer by continuing to grow a same material as that of the first film layer on a side, facing away from the second substrate layer, of the first film layer, comprises:
    continuing to grow the same material as that of the first film layer on the side of the first film layer facing away from the second substrate layer to prepare the second film layer by one of metal-organic chemical vapor deposition (MOCVD) and hydride vapor phase epitaxy (HVPE).

7. The method for preparing the self-supporting substrate according to claim 1, wherein the stripping the second substrate layer from the second film layer, comprises:
    stripping the second substrate layer from the second film layer by chemical etching.

8. The method for preparing the self-supporting substrate according to claim 1, wherein materials of the second substrate layer and the first film layer are a same series of materials.

9. The method for preparing the self-supporting substrate according to claim 8, wherein the material of the first film layer is a gallium nitride (GaN) series material.

10. The method for preparing the self-supporting substrate according to claim 1, wherein a surface of the second film layer previously connected to the second substrate layer is a Ga surface and is oriented to a C axis.

11. The method for preparing the self-supporting substrate according to claim 1, wherein after the stripping the second substrate layer from the second film layer, the method further comprises:

planarizing the second film layer by chemical mechanical polishing (CMP).

* * * * *